(12) United States Patent
Xu et al.

(10) Patent No.: US 11,791,843 B2
(45) Date of Patent: Oct. 17, 2023

(54) METHODS AND APPARATUS FOR CONSTRUCTING POLAR CODES

(71) Applicant: QUALCOMM INCORPORATED, San Diego, CA (US)

(72) Inventors: Changlong Xu, Beijing (CN); Jian Li, Beijing (CN); Jilei Hou, San Diego, CA (US); Chao Wei, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/443,992

(22) Filed: Jul. 29, 2021

(65) Prior Publication Data

US 2021/0359706 A1 Nov. 18, 2021

Related U.S. Application Data

(63) Continuation of application No. 16/320,038, filed as application No. PCT/CN2017/089977 on Jun. 26, 2017, now Pat. No. 11,128,316.

(30) Foreign Application Priority Data

Jul. 25, 2016 (WO) ................ PCT/CN2016/091592

(51) Int. Cl.
*H03M 13/00* (2006.01)
*H03M 13/13* (2006.01)
(Continued)

(52) U.S. Cl.
CPC ......... *H03M 13/13* (2013.01); *H03M 13/353* (2013.01); *H04B 17/336* (2015.01);
(Continued)

(58) Field of Classification Search
CPC ... H03M 13/13; H03M 13/353; H04L 1/0057; H04L 1/0013; H04L 1/1822; H04L 1/1812; H04L 1/0643; H04L 1/0003
See application file for complete search history.

(56) References Cited

U.S. PATENT DOCUMENTS 8,325,826 B2 12/2012 Laroia et al.
8,337,775 B2 12/2012 Pugia et al.
(Continued)

FOREIGN PATENT DOCUMENTS

CN 102122966 A 7/2011
CN 102164025 A 8/2011
(Continued)

OTHER PUBLICATIONS

Deng R., et al., "On the Polar Code Encoding in Fading Channels", Cornell University Library, 201 Olin Library Cornell University Ithaca, NY 1485310, Mar. 8, 2016 (Mar. 8, 2016), pp. 1-5, XP80687855, Retrieved from the Internet: URL: https://arxiv.org/pdf/1603.02365v1.pdf, section IV. Non-Universality of Polar Codes.
(Continued)

*Primary Examiner* — Esaw T Abraham
(74) *Attorney, Agent, or Firm* — QUALCOMM Incorporated

(57) ABSTRACT

Methods and apparatus for constructing polar codes are provided. A transmitter determines at least one set of parameters corresponding to data to be transmitted, and a set of sorting indices corresponding to bits of the data to be transmitted based on the set of parameters, the set of sorting indices indicating a position set of the bits to be transmitted. The transmitter polar encodes the data based at least on the set of parameters and the set of sorting indices to generate a coded block of the data, and transmits the coded block of the data.

15 Claims, 12 Drawing Sheets

(51) Int. Cl.
*H04B 17/336* (2015.01)
*H03M 13/35* (2006.01)
*H04L 1/00* (2006.01)
*H04L 1/1812* (2023.01)

(52) U.S. Cl.
CPC .......... *H04L 1/0003* (2013.01); *H04L 1/0013* (2013.01); *H04L 1/1812* (2013.01)

(56) References Cited

U.S. PATENT DOCUMENTS

| | | | |
|---|---|---|---|
| 8,347,186 B1* | 1/2013 | Arikan | H04L 1/0009 714/781 |
| 9,362,956 B2* | 6/2016 | Mahdavifar | H03M 13/27 |
| 9,628,113 B2 | 4/2017 | Jeong et al. | |
| 10,243,592 B2* | 3/2019 | Li | H03M 13/616 |
| 10,333,552 B2* | 6/2019 | Shen | H03M 13/13 |
| 10,469,139 B2 | 11/2019 | Wei et al. | |
| 2002/0194571 A1 | 12/2002 | Parr et al. | |
| 2009/0086839 A1 | 4/2009 | Xu et al. | |
| 2013/0117344 A1* | 5/2013 | Gross | G06F 17/16 708/490 |
| 2014/0016571 A1 | 1/2014 | Yucek et al. | |
| 2014/0019820 A1 | 1/2014 | Vardy et al. | |
| 2014/0169492 A1* | 6/2014 | Mahdavifar | H03M 13/13 375/267 |
| 2014/0173376 A1 | 6/2014 | Jeong et al. | |
| 2015/0026543 A1 | 1/2015 | Li et al. | |
| 2015/0293716 A1 | 10/2015 | Jiang et al. | |
| 2015/0381209 A1 | 12/2015 | Roh et al. | |
| 2016/0013810 A1* | 1/2016 | Gross | H03M 13/09 714/776 |
| 2016/0182187 A1 | 6/2016 | Kim et al. | |
| 2016/0191129 A1 | 6/2016 | Noh et al. | |
| 2017/0288703 A1 | 10/2017 | Shen et al. | |
| 2019/0268022 A1 | 8/2019 | Xu et al. | |

FOREIGN PATENT DOCUMENTS

| | | |
|---|---|---|
| CN | 103023618 A | 4/2013 |
| CN | 103281166 A | 9/2013 |
| CN | 103684477 A | 3/2014 |
| CN | 103780329 A | 5/2014 |
| CN | 103825669 A | 5/2014 |
| CN | 103916220 A | 7/2014 |
| CN | 104079370 A | 10/2014 |
| CN | 104202276 A | 12/2014 |
| CN | 105009541 A | 10/2015 |
| CN | 105164959 A | 12/2015 |
| CN | 105227189 A | 1/2016 |
| EP | 2922227 A1 | 9/2015 |
| WO | WO-2006098992 A1 | 9/2006 |
| WO | WO-2014116041 A1 | 7/2014 |

OTHER PUBLICATIONS

International Preliminary Reporton Patentability—PCT/CN2016/091592, The International Bureau of WIPO—Geneva, Switzerland, dated Nov. 2, 2018.
International Preliminary Report on Patentability for PCT/CN2017/089977, dated Nov. 6, 2018.
International Search Report and Written Opinion—PCT/CN2016/091592—ISA/EPO—dated Apr. 27, 2017.
International Search Report and Written Opinion—PCT/CN2017/089977—ISA/EPO—dated Sep. 28, 2017.
Ku G., et al., "Resource Allocation and Link Adaptation in LTE and LTE Advanced: A Tutorial", IEEE Communications Surveys & Tutorials, vol. 17, No. 3, Third Quarter 2015, pp. 1605-1633, XP055263979, New York, Dec. 18, 2014, DOI: 10.1109/COMST.2014.2383691, Retrieved from the Internet: URL: https://ieeexplore.ieee.org/document/6990494 [retrieved on Apr. 8, 2016], Section VI, "Link Adaptation", figures 1,2,3,6,7,10; table VIII.
Mediatek Inc: "Discussion on Polar Code Design and Performance", 3GPP TSG RAN WG1 Meeting #85bis, 3GPP Draft; R1-165454 Discussion on Polar Code Design and Performance, 3rd Generation Partnership Project (3GPP), Mobile Competence Centre, 650, Route Des Lucioles ; F-06921 Sophia-Antipolis Cedex, France, vol. RAN WG1, No. Nanjing, China; May 23, 2016-May 27, 2016, May 24, 2016 (May 24, 2016), 7 Pages, XP051104208, Retrieved from the Internet: URL: http://www.3gpp.org/ftp/Meetings_3GPP_SYNC/RAN1/Docs/ [retrieved on May 24, 2016].
Supplementary European Search Report—EP17833370—Search Authority—Munich—dated Feb. 7, 2020.
Chen K., "Research on Polar Coding Theory and Practical Applications", Chinese Excellent Doctoral Dissertation Full Text Database (PhD) Information Technology Series, vol. 4, 2015, pp. 22-28.
Vangala H., et al., "A Comparative Study of Polar Code Constructions", Jan. 11, 2015, https://arxiv.org/abs/1501.02473, pp. 1-9.

* cited by examiner

METHODS AND APPARATUS FOR CONSTRUCTING POLAR CODES

CROSS-REFERENCE TO RELATED APPLICATION & PRIORITY CLAIM

This application is continuation of U.S. patent application Ser. No. 16/320,038, filed Jan. 23, 2019, (now U.S. Pat. No. 11,128,316, issued Sep. 21, 2021), which is a national stage application, filed under 35 U.S.C. § 371, of International Patent Application No. PCT/CN2017/089977, filed on Jun. 26, 2017, which claims foreign priority to International Patent Application No. PCT/CN/2016/091562, filed Jul. 25, 2016, all of which are incorporated by reference herein in their entirety.

FIELD

The present disclosure relates generally to wireless communication, and more particularly, to methods and apparatus for constructing polar codes.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE/LTE-Advanced is a set of enhancements to the Universal Mobile Telecommunications System (UMTS) mobile standard promulgated by Third Generation Partnership Project (3GPP). It is designed to better support mobile broadband Internet access by improving spectral efficiency, lower costs, improve services, make use of new spectrum, and better integrate with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of future wireless communication networks beyond LTE.

SUMMARY

Certain aspects of the present disclosure provide a method for constructing a polar code by a transmitter. The method generally includes determining at least one set of parameters corresponding to data to be transmitted, and a set of sorting indices corresponding to bits of the data to be transmitted based on the set of parameters, the set of sorting indices indicating a position set of the bits to be transmitted, polar encoding the data based at least on the set of parameters and the set of sorting indices to generate a coded block of the data, and transmitting the coded block of the data.

Certain aspects of the present disclosure provide a method for decoding a polar code by a receiver. The method generally includes receiving a coded block of data generated by polar encoding, determining at least one set of parameters corresponding to the data, and a set of sorting indices corresponding to bits of the data based on the set of parameters, the set of sorting indices indicating a position set of the bits of the data, and decoding the received coded block of data based at least on the set of parameters and the set of sorting indices to obtain decoded data.

Certain aspects of the present disclosure provide an apparatus for constructing a polar code by a transmitter. The apparatus generally includes at least one processor and a memory coupled to the at least one processor. The at least one processor is generally configured to determine at least one set of parameters corresponding to data to be transmitted, and a set of sorting indices corresponding to bits of the data to be transmitted based on the set of parameters, the set of sorting indices indicating a position set of the bits to be transmitted, polar encode the data based at least on the set of parameters and the set of sorting indices to generate a coded block of the data, and transmit the coded block of the data.

Certain aspects of the present disclosure provide an apparatus for decoding a polar code by a receiver. The apparatus generally includes at least one processor and a memory coupled to the at least one processor. The at least one processor is generally configured to receive a coded block of data generated by polar encoding, determine at least one set of parameters corresponding to the data, and a set of sorting indices corresponding to bits of the data based on the set of parameters, the set of sorting indices indicating a position set of the bits of the data, and decode the received coded block of data based at least on the set of parameters and the set of sorting indices to obtain decoded da.

Aspects generally include methods, apparatus, systems, computer program products, computer-readable medium, and processing systems, as substantially described herein with reference to and as illustrated by the accompanying drawings. "LTE" refers generally to LTE, LTE-Advanced (LTE-A), LTE in an unlicensed spectrum (LTE-whitespace), etc.

DETAILED DESCRIPTION

Figure 1:
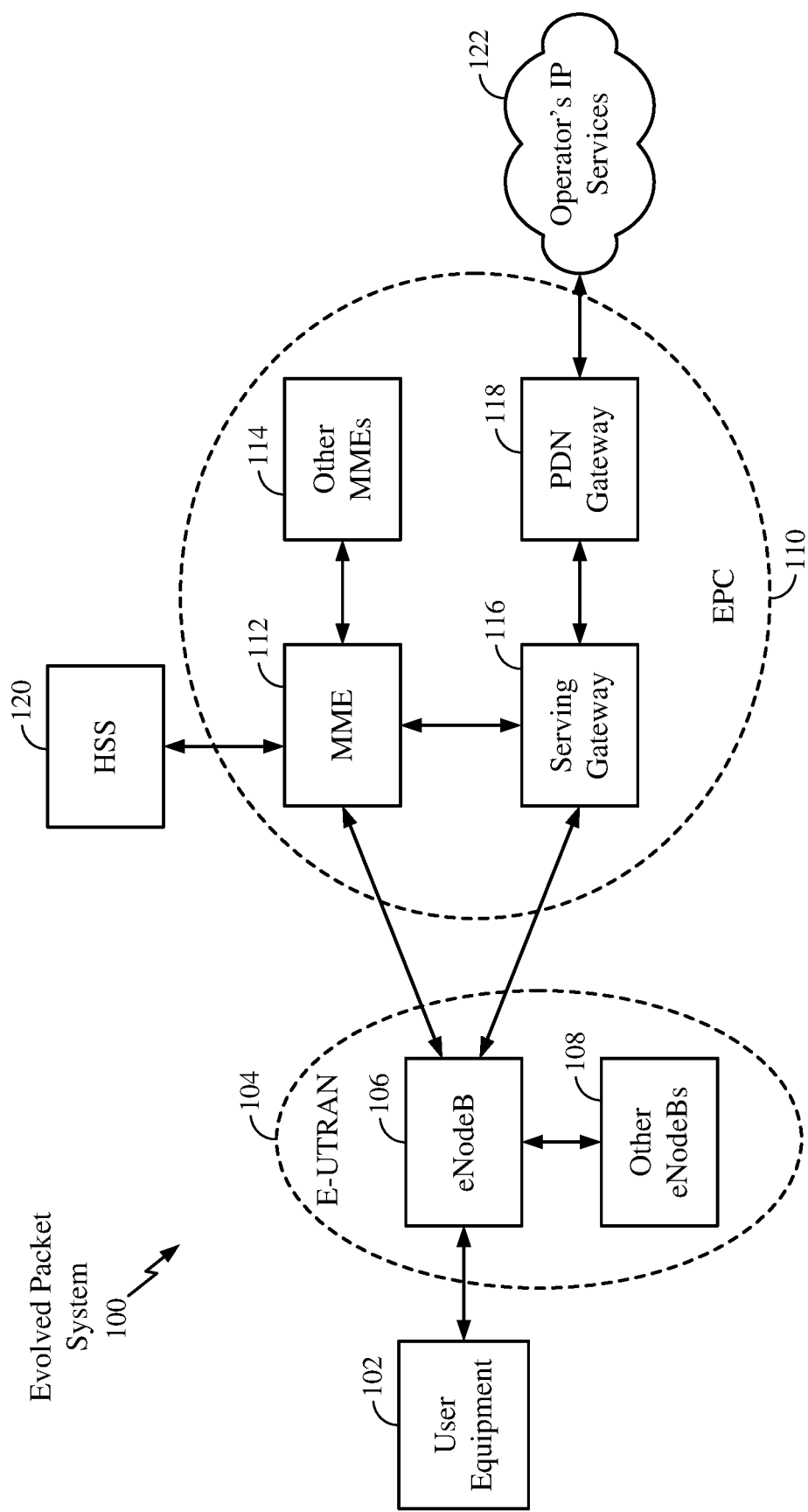
FIG. 1 is a diagram illustrating an example of a network architecture.

Polar codes are the first codes with an explicit construction to provably achieve the channel capacity for symmetric binary-input discrete memoryless channels. To construct Polar codes, the rows of the Hadamard matrices corresponding to the good channels are selected for information bits. The bad channels are used for frozen bits with fixed value of zeros. In a practical system, density evolution or Gaussian approximation is generally used to determine the bit-error probability of each channel. For example, if N information bits are desired, the best N channels (with low error probability) are selected for information bits while the remaining channels are designated as frozen bits. In general, the bit-error probabilities of all the channels are sorted to determine the best and worst channels, and a position of each bit channel is identified by a corresponding sorting index. Thus, the sorting indices of the bit channels are generally needed in order to construct polar codes.

To support different block sizes with different rates, different position sets for information bits are required indicating different possibilities for positions of the information bits. In addition, to get an optimum code construction, the position sets for information bits may be different even for the same block size with different rates. In some cases, a Binary vector with 0s for positions of frozen bits and 1s for positions of information bits, may be used to represent the position set for information bits. However, a very large memory may be needed to store the vector for indication of the positions of information bits.

Certain aspects of the present disclosure discuss techniques for constructing polar codes including dynamically generating (e.g., "on the fly") vectors or sorting indices indicating position sets of information bits for the construction, instead of storing pre-defined vectors in memory, thus saving memory and leading to a more efficient construction of polar codes for both traffic and control channels.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), wearable device (e.g., smart watch, smart glasses, smart bracelet, smart wristband, smart ring, smart clothing, etc.), medical devices or equipment, biometric sensors/devices, an entertainment device (e.g., music device, video device, satellite radio, gaming device, etc.), a vehicular component or sensor, smart meters/sensors, industrial manufacturing equipment, a global positioning system device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link. Some UEs may be considered machine-type communication (MTC) UEs, which may include remote devices, that may communicate with a base station, another remote device, or some other entity. Machine type communications (MTC) may refer to communication involving at least one remote device on at least one end of the communication and may include forms of data communication which involve one or more entities that do not necessarily need human interaction. MTC UEs may include UEs that are capable of MTC communications with MTC servers and/or other MTC devices through Public Land Mobile Networks (PLMN), for example. Examples of MTC devices include sensors, meters, location tags, monitors, drones, robots/robotic devices, etc. MTC UEs, as well as other types of UEs, may be implemented as NB-IoT (narrowband internet of things) devices.

FIG. 1 is a diagram illustrating an LTE network architecture 100 in which aspects of the present disclosure may be practiced.

In certain aspects, a transmitter (e.g., UE 102 or eNB 106) determines at least one set of parameters corresponding to data to be transmitted, and a set of sorting indices corresponding to bits of the data to be transmitted based on the set of parameters, the set of sorting indices indicating a position set of the bits to be transmitted. The transmitter polar encodes the data based at least on the set of parameters and the set of sorting indices to generate a coded block of the data. The transmitter then transmits the coded block of the data.

In certain aspects, a receiver (e.g., UE 102 or eNB 106) receives a coded block of data generated by polar encoding. The receiver determines at least one set of parameters corresponding to the data, and a set of sorting indices corresponding to bits of the data based on the set of parameters, the set of sorting indices indicating a position set of the bits of the data. The receiver then decodes the received coded block of data based at least on the set of parameters and the set of sorting indices to obtain decoded data.

The LTE network architecture 100 may be referred to as an Evolved Packet System (EPS) 100. The EPS 100 may include one or more user equipment (UE) 102, an Evolved UMTS Terrestrial Radio Access Network (E-UTRAN) 104, an Evolved Packet Core (EPC) 110, a Home Subscriber Server (HSS) 120, and an Operator's IP Services 122. The EPS can interconnect with other access networks, but for simplicity those entities/interfaces are not shown. Exemplary other access networks may include an IP Multimedia Subsystem (IMS) PDN, Internet PDN, Administrative PDN (e.g., Provisioning PDN), carrier-specific PDN, operator-specific PDN, and/or GPS PDN. As shown, the EPS provides packet-switched services, however, as those skilled in the art will readily appreciate, the various concepts presented throughout this disclosure may be extended to networks providing circuit-switched services.

The E-UTRAN includes the evolved Node B (eNB) 106 and other eNBs 108. The eNB 106 provides user and control plane protocol terminations toward the UE 102. The eNB 106 may be connected to the other eNBs 108 via an X2 interface (e.g., backhaul). The eNB 106 may also be referred to as a base station, a base transceiver station, a radio base station, a radio transceiver, a transceiver function, a basic service set (BSS), an extended service set (ESS), an access point, or some other suitable terminology. The eNB 106 may provide an access point to the EPC 110 for a UE 102. Examples of UEs 102 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a netbook, a smart book, an ultrabook, a drone, a robot, a sensor, a monitor, a meter, a camera/security camera, a gaming device, a wearable device (e.g., smart watch, smart glasses, smart ring, smart bracelet, smart wrist band, smart jewelry, smart clothing, etc.), any other similar functioning device, etc. The UE 102 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The eNB 106 is connected by an S1 interface to the EPC 110. The EPC 110 includes a Mobility Management Entity (MME) 112, other MMEs 114, a Serving Gateway 116, and a Packet Data Network (PDN) Gateway 118. The MME 112 is the control node that processes the signaling between the UE 102 and the EPC 110. Generally, the MME 112 provides bearer and connection management. All user IP packets are transferred through the Serving Gateway 116, which itself is connected to the PDN Gateway 118. The PDN Gateway 118 provides UE IP address allocation as well as other functions. The PDN Gateway 118 is connected to the Operator's IP Services 122. The Operator's IP Services 122 may include, for example, the Internet, the Intranet, an IP Multimedia Subsystem (IMS), and a PS (packet-switched) Streaming Service (PSS). In this manner, the UE 102 may be coupled to the PDN through the LTE network.

Figure 2:
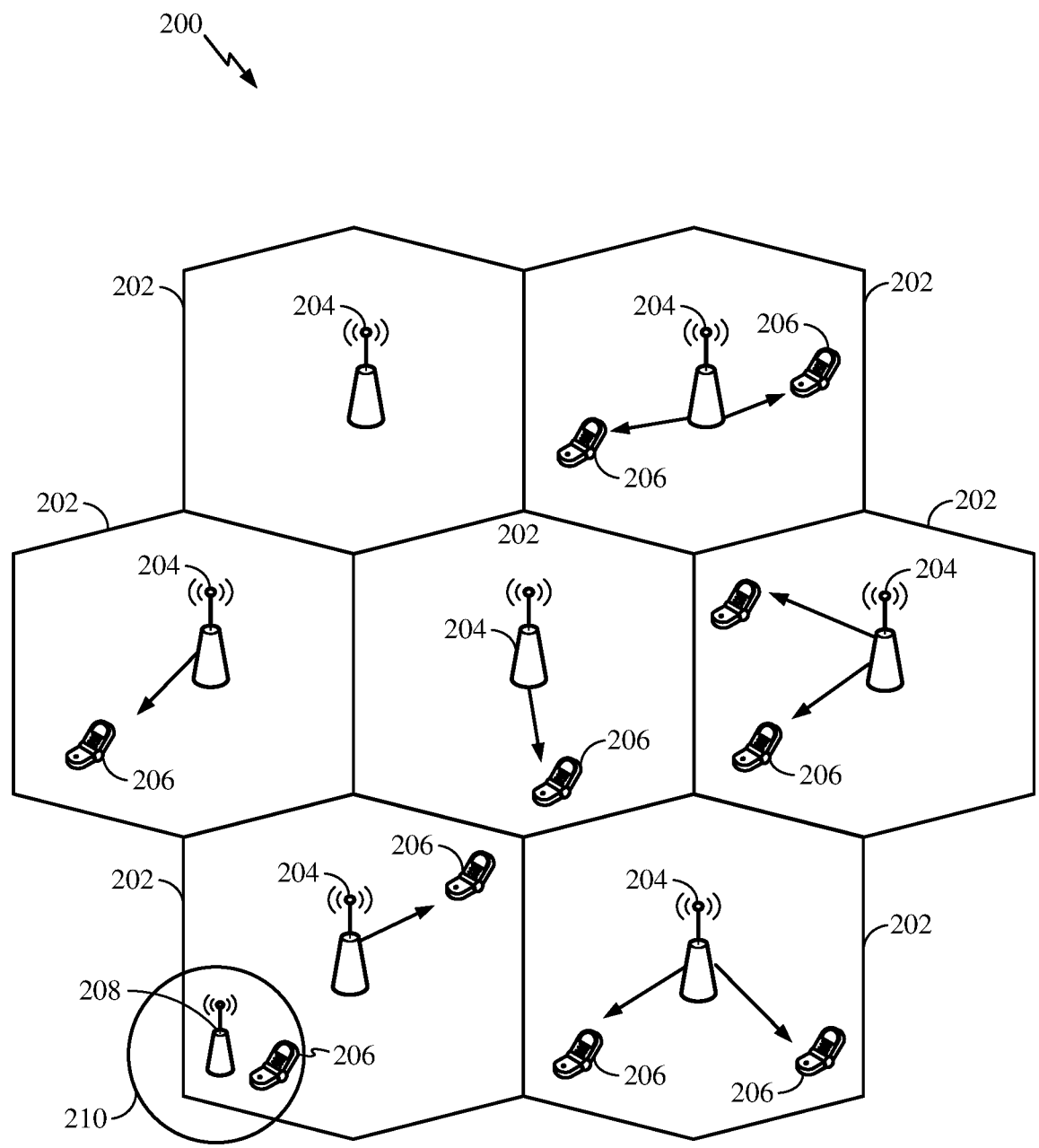
FIG. 2 is a diagram illustrating an example of an access network.

FIG. 2 is a diagram illustrating an example of an access network 200 in an LTE network architecture in which aspects of the present disclosure may be practiced. For example, UEs 206 and eNBs 204 may be configured to implement techniques for efficient construction of polar codes in accordance with aspects of the present disclosure.

In this example, the access network 200 is divided into a number of cellular regions (cells) 202. One or more lower power class eNBs 208 may have cellular regions 210 that overlap with one or more of the cells 202. A lower power class eNB 208 may be referred to as a remote radio head (RRH). The lower power class eNB 208 may be a femto cell (e.g., home eNB (HeNB)), pico cell, or micro cell. The macro eNBs 204 are each assigned to a respective cell 202 and are configured to provide an access point to the EPC 110 for all the UEs 206 in the cells 202. There is no centralized controller in this example of an access network 200, but a centralized controller may be used in alternative configurations. The eNBs 204 are responsible for all radio related functions including radio bearer control, admission control, mobility control, scheduling, security, and connectivity to the serving gateway 116. The network 200 may also include one or more relays (not shown). According to one application, a UE may serve as a relay.

The modulation and multiple access scheme employed by the access network 200 may vary depending on the particular telecommunications standard being deployed. In LTE applications, OFDM is used on the DL and SC-FDMA is used on the UL to support both frequency division duplexing (FDD) and time division duplexing (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 204 may have multiple antennas supporting MIMO technology. The use of MIMO technology enables the eNBs 204 to exploit the spatial domain to support spatial multiplexing, beamforming, and transmit diversity. Spatial multiplexing may be used to transmit different streams of data simultaneously on the same frequency. The data streams may be transmitted to a single UE 206 to increase the data rate or to multiple UEs 206 to increase the overall system capacity. This is achieved by spatially precoding each data stream (e.g., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the eNB 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network may be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
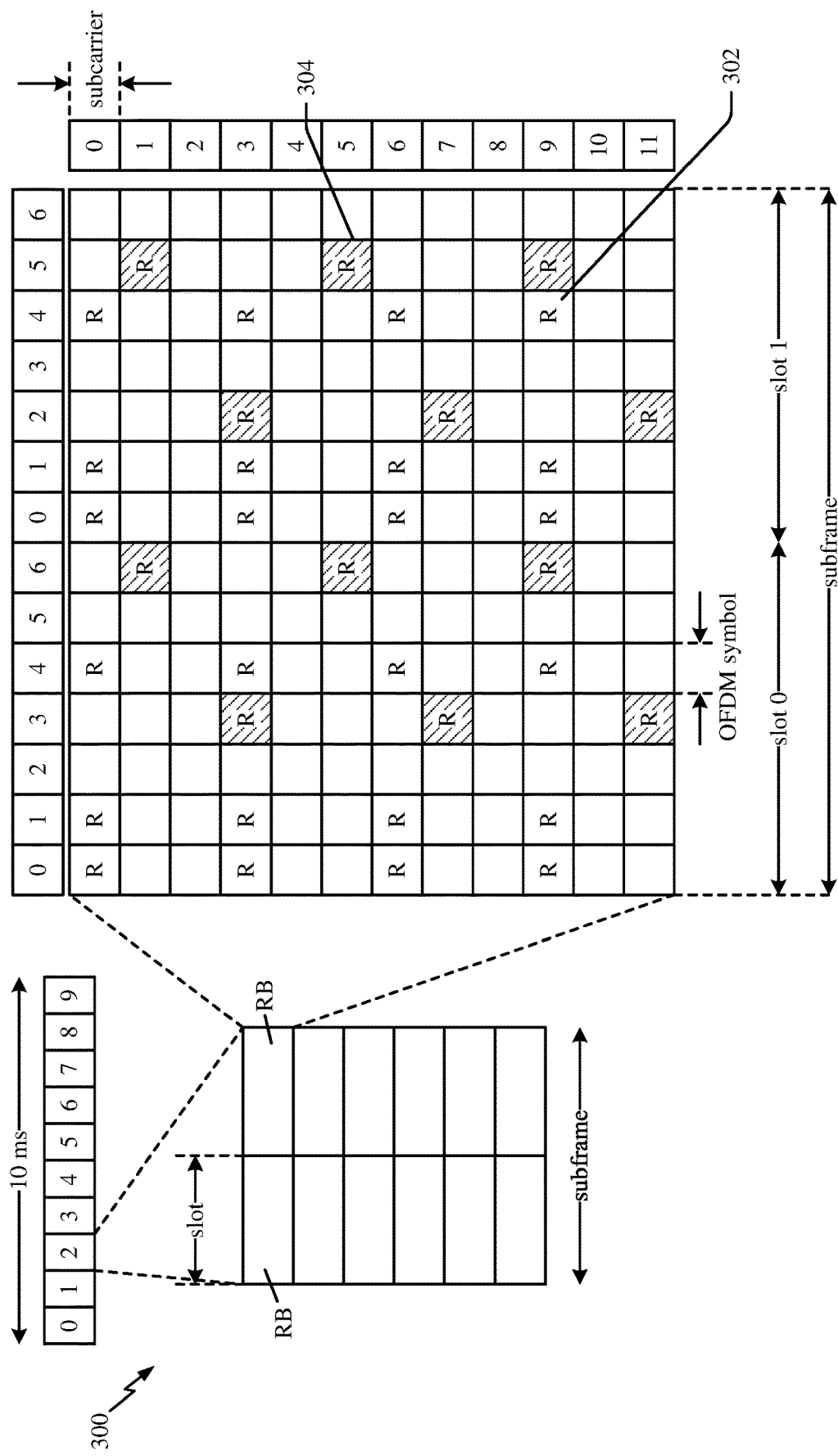
FIG. 3 is a diagram illustrating an example of a DL frame structure in LTE.

FIG. 3 is a diagram 300 illustrating an example of a DL frame structure in LTE. A frame (10 ms) may be divided into 10 equally sized sub-frames with indices of 0 through 9. Each sub-frame may include two consecutive time slots. A resource grid may be used to represent two time slots, each time slot including a resource block. The resource grid is divided into multiple resource elements. In LTE, a resource block contains 12 consecutive subcarriers in the frequency domain and, for a normal cyclic prefix in each OFDM symbol, 7 consecutive OFDM symbols in the time domain, or 84 resource elements. For an extended cyclic prefix, a resource block contains 6 consecutive OFDM symbols in the time domain and has 72 resource elements. Some of the resource elements, as indicated as R 302, R 304, include DL reference signals (DL-RS). The DL-RS include Cell-specific RS (CRS) (also sometimes called common RS) 302 and UE-specific RS (UE-RS) 304. UE-RS 304 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

In LTE, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix (CP). The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in the first symbol period of each subframe. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. The eNB may send a Physical HARQ Indicator Channel (PHICH) and a Physical Downlink Control Channel (PDCCH) in the first M symbol periods of each subframe. The PHICH may carry information to support hybrid automatic repeat request (HARQ). The PDCCH may carry information on resource allocation for UEs and control information for downlink channels. The eNB may send a Physical Downlink Shared Channel (PDSCH) in the remaining symbol periods of each subframe. The PDSCH may carry data for UEs scheduled for data transmission on the downlink.

The eNB may send the PSS, SSS, and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH, and PHICH in a broadcast manner to all UEs, may send the PDCCH in a unicast manner to specific UEs, and may also send the PDSCH in a unicast manner to specific UEs.

A number of resource elements may be available in each symbol period. Each resource element (RE) may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1, and 2. The PDCCH may occupy 9, 18, 36, or 72 REGs, which may be selected from the available REGs, in the first M symbol periods, for example. Only certain combinations of REGs may be allowed for the PDCCH. In aspects of the present methods and apparatus, a subframe may include more than one PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

Figure 4:
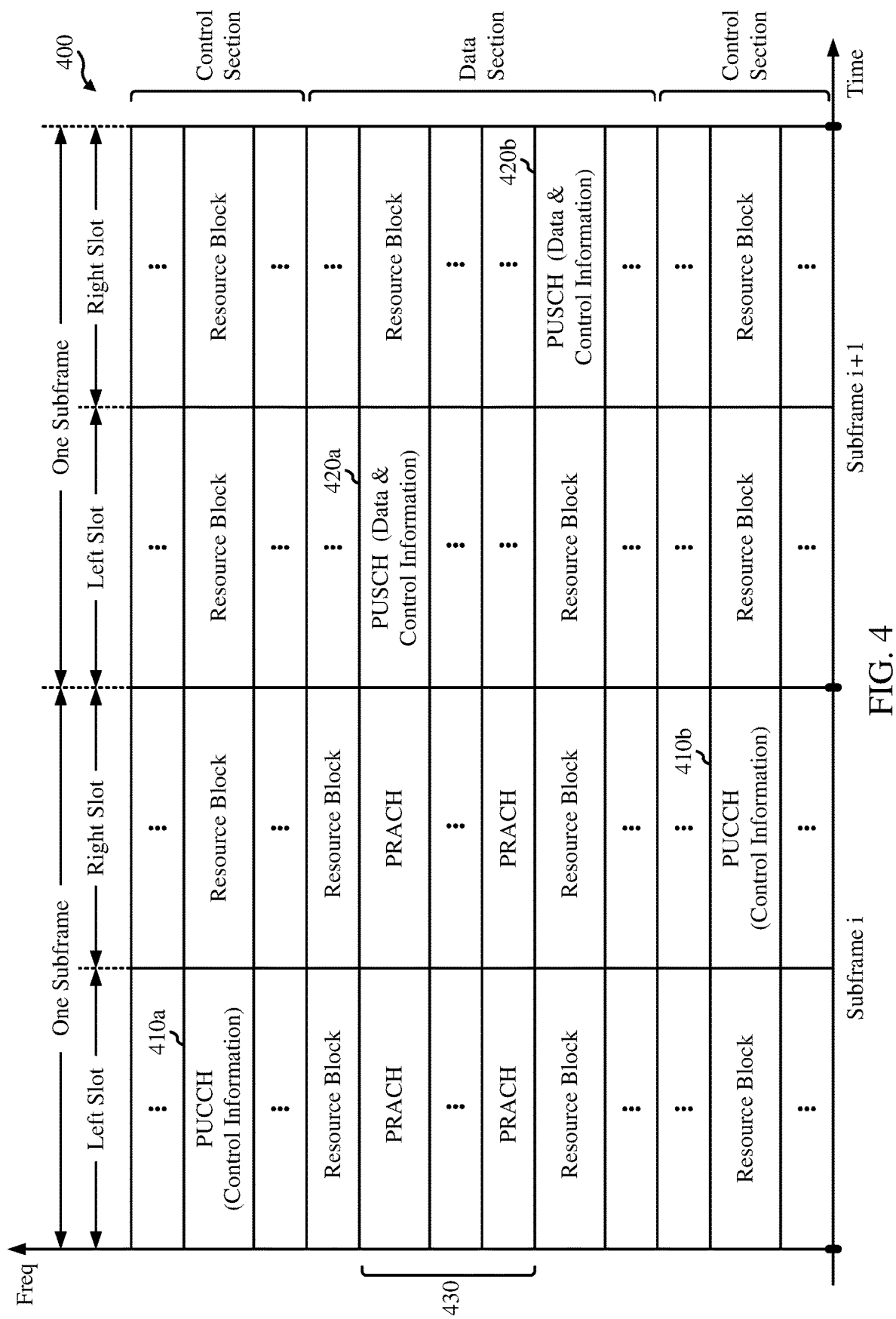
FIG. 4 is a diagram illustrating an example of an UL frame structure in LTE.

FIG. 4 is a diagram 400 illustrating an example of an UL frame structure in LTE. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410a, 410b in the control section to transmit control information to an eNB. The UE may also be assigned resource blocks 420a, 420b in the data section to transmit data to the eNB. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequency.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (1 ms) or in a sequence of few contiguous subframes and a UE can make only a single PRACH attempt per frame (10 ms).

Figure 5:
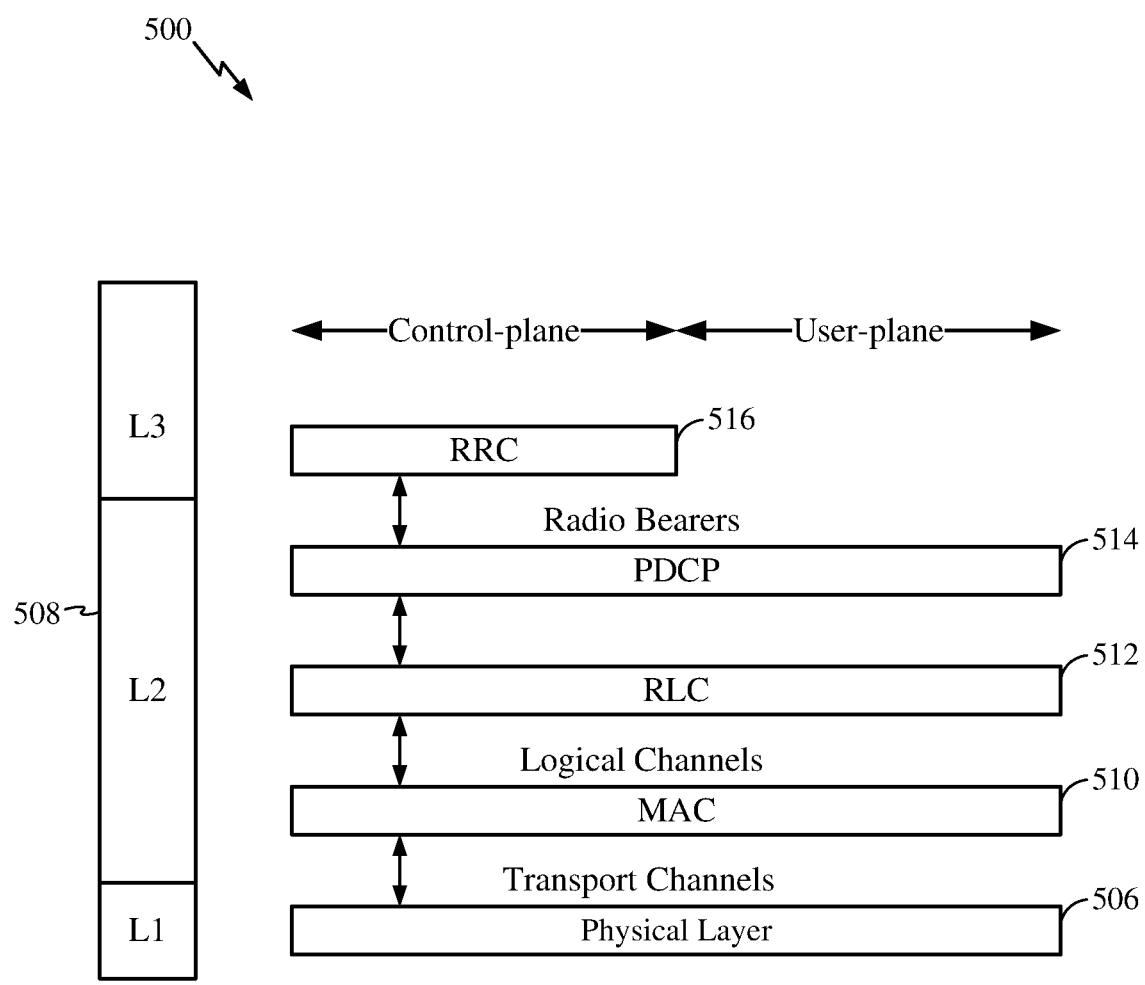
FIG. 5 is a diagram illustrating an example of a radio protocol architecture for the user and control plane.

FIG. 5 is a diagram 500 illustrating an example of a radio protocol architecture for the user and control planes in LTE. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 506. Layer 2 (L2 layer) 508 is above the physical layer 506 and is responsible for the link between the UE and eNB over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the eNB on the network side. Although not shown, the UE may have several upper layers above the L2 layer 508 including a network layer (e.g., IP layer) that is terminated at the PDN gateway 118 on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between eNBs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations.

In the control plane, the radio protocol architecture for the UE and eNB is substantially the same for the physical layer 506 and the L2 layer 508 with the exception that there is no header compression function for the control plane. The control plane also includes a radio resource control (RRC) sublayer 516 in Layer 3 (L3 layer). The RRC sublayer 516 is responsible for obtaining radio resources (i.e., radio bearers) and for configuring the lower layers using RRC signaling between the eNB and the UE.

Figure 6:
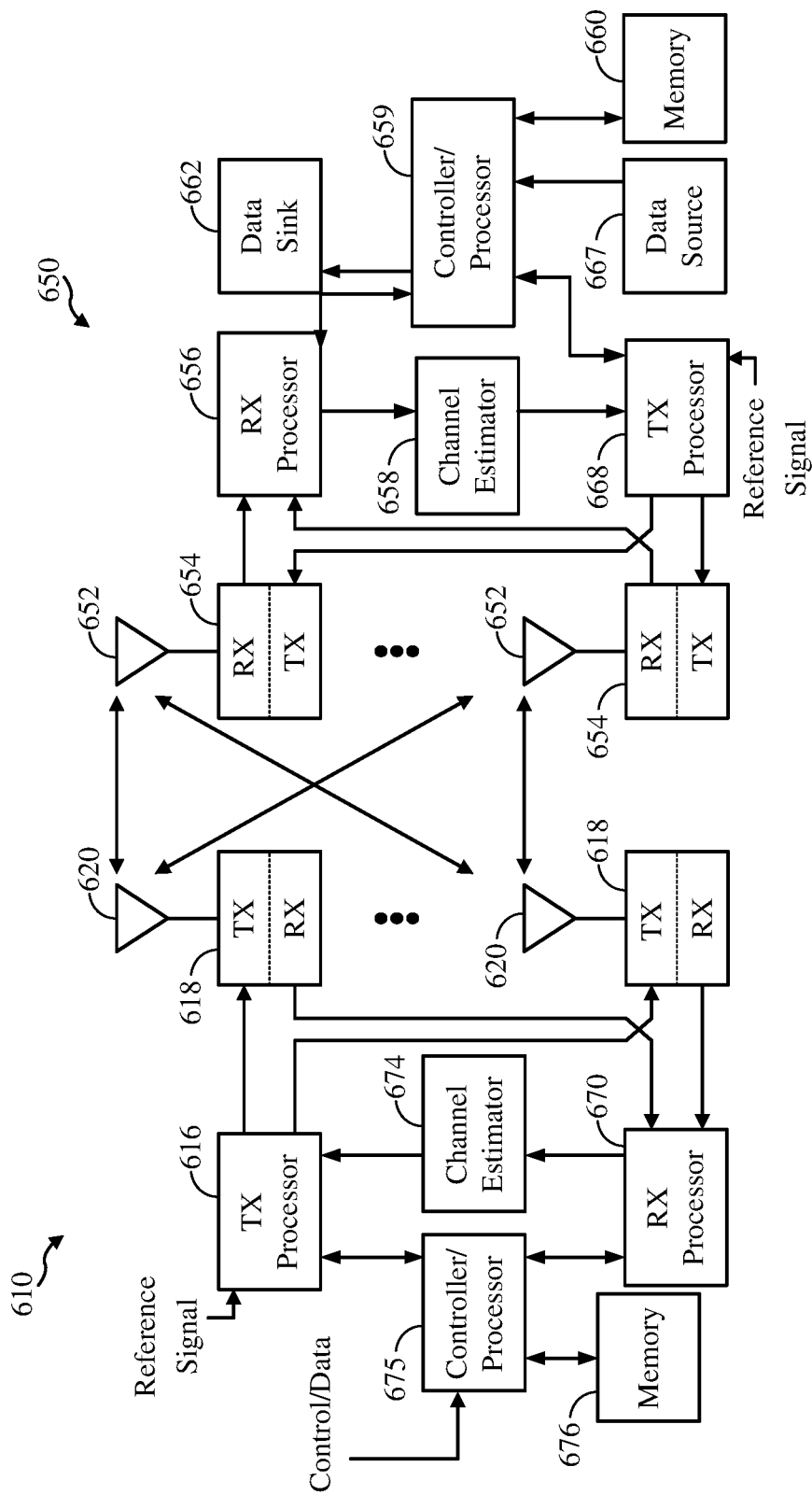
FIG. 6 is a diagram illustrating an example of an evolved Node B and user equipment in an access network, in accordance with certain aspects of the disclosure.

FIG. 6 is a block diagram of an eNB 610 in communication with a UE 650 in an access network, in which aspects of the present disclosure may be practiced.

In certain aspects, a transmitter (e.g., UE 650 or eNB 610) determines at least one set of parameters corresponding to data to be transmitted, and a set of sorting indices corresponding to bits of the data to be transmitted based on the set of parameters, the set of sorting indices indicating a position set of the bits to be transmitted. The transmitter polar encodes the data based at least on the set of parameters and the set of sorting indices to generate a coded block of the data. The transmitter then transmits the coded block of the data.

In certain aspects, a receiver (e.g., UE 650 or eNB 610) receives a coded block of data generated by polar encoding. The receiver determines at least one set of parameters corresponding to the data, and a set of sorting indices corresponding to bits of the data based on the set of parameters, the set of sorting indices indicating a position set of the bits of the data. The receiver then decodes the received coded block of data based at least on the set of parameters and the set of sorting indices to obtain decoded data.

In the DL, upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for HARQ operations, retransmission of lost packets, and signaling to the UE 650.

The TX processor 616 implements various signal processing functions for the L1 layer (i.e., physical layer). The signal processing functions includes coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream is then provided to a different antenna 620 via a separate transmitter 618TX. Each transmitter 618TX modulates an RF carrier with a respective spatial stream for transmission.

At the UE 650, each receiver 654RX receives a signal through its respective antenna 652. Each receiver 654RX recovers information modulated onto an RF carrier and provides the information to the receiver (RX) processor 656. The RX processor 656 implements various signal processing functions of the L1 layer. The RX processor 656 performs spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each sub-carrier of the OFDM signal. The symbols on each subcarrier, and the reference signal, is recovered and demodulated by determining the most likely signal constellation points transmitted by the eNB 610. These soft decisions may be based on channel estimates computed by the channel estimator 658. The soft decisions are then decoded and deinterleaved to recover the data and control signals that were originally transmitted by the eNB 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the controller/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the eNB 610, the controller/processor 659 implements the L2 layer for the user plane and the control plane by providing header compression, ciphering, packet segmentation and reordering, and multiplexing between logical and transport channels based on radio resource allocations by the eNB 610. The controller/processor 659 is also responsible for HARQ operations, retransmission of lost packets, and signaling to the eNB 610.

Channel estimates derived by a channel estimator 658 from a reference signal or feedback transmitted by the eNB 610 may be used by the TX processor 668 to select the appropriate coding and modulation schemes, and to facilitate spatial processing. The spatial streams generated by the TX processor 668 are provided to different antenna 652 via separate transmitters 654TX. Each transmitter 654TX modulates an RF carrier with a respective spatial stream for transmission.

The UL transmission is processed at the eNB 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 670 may implement the L1 layer.

The controller/processor 675 implements the L2 layer. The controller/processor 675 can be associated with a memory 676 that stores program codes and data. The memory 676 may be referred to as a computer-readable medium. In the UL, the controller/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations. The controllers/processors 675, 659 may direct the operations at the eNB 610 and the UE 650, respectively.

Figure 9:
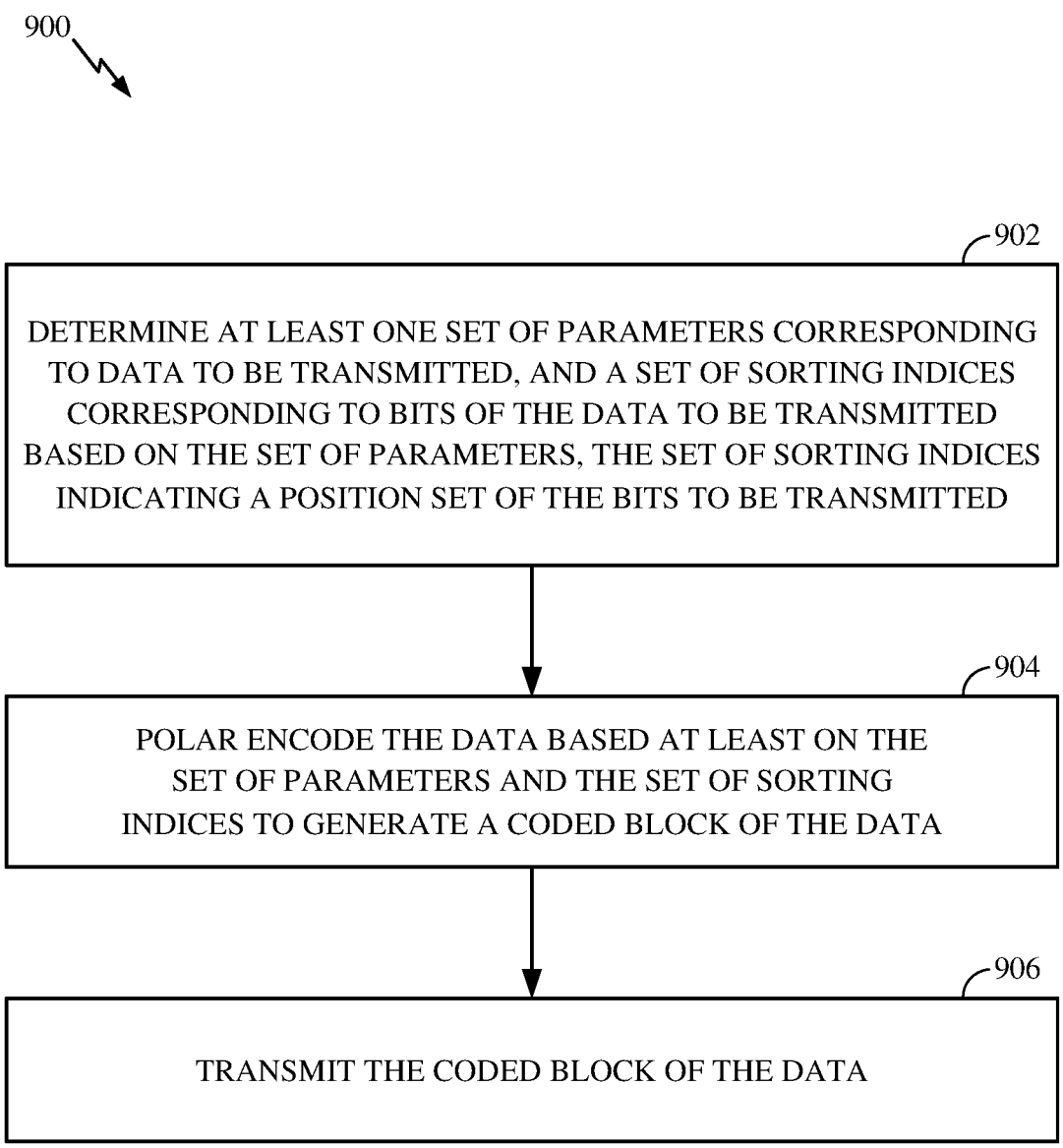
FIG. 9 illustrates example operations 900 performed by a transmitter (e.g., UE, eNB or any other network node or element thereof) for efficient construction of polar codes, in accordance with certain aspects of the present disclosure.
Figure 10:
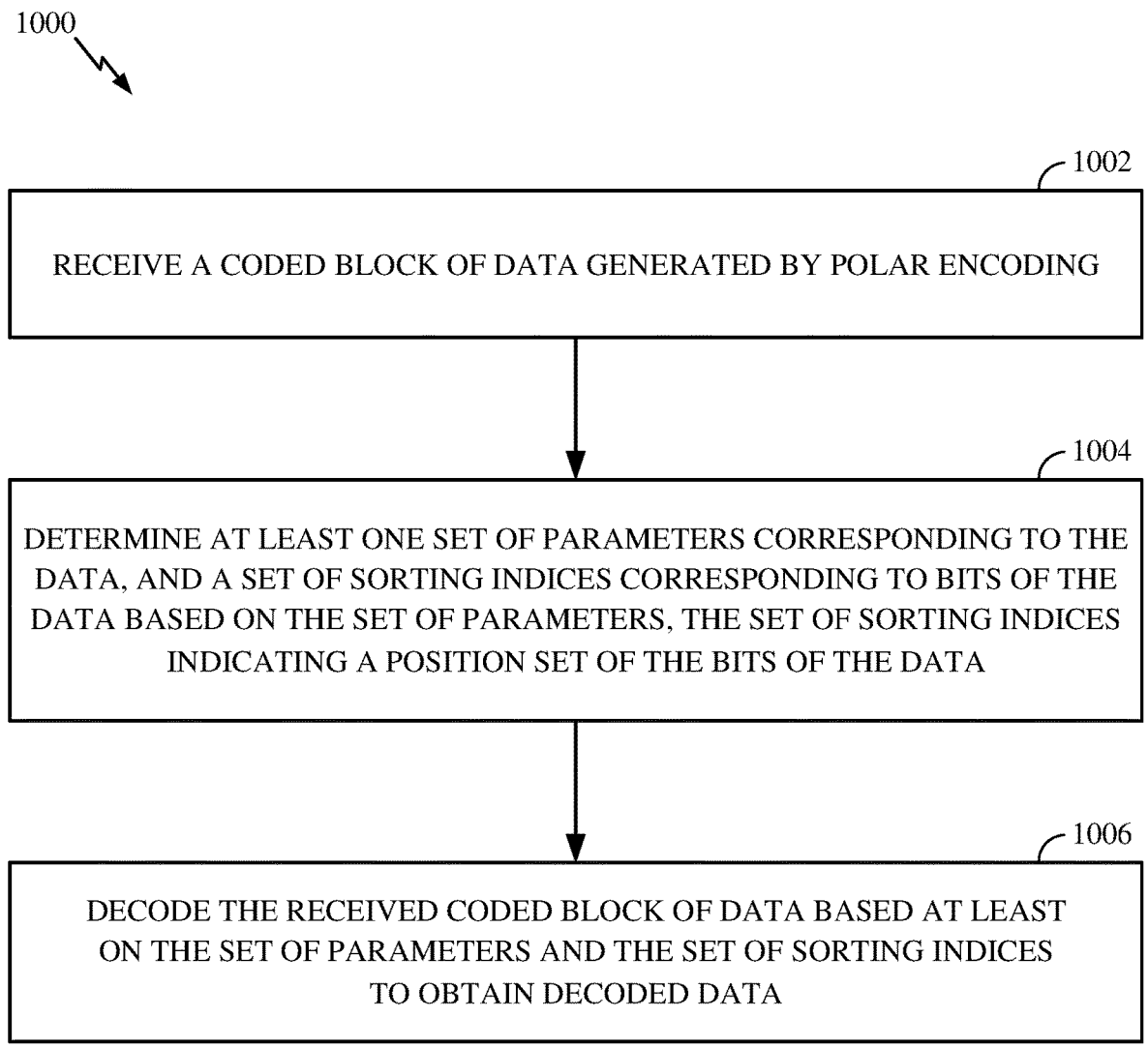
FIG. 10 illustrates example operations 1000 performed by a receiver (e.g., UE, eNB or any other network node or element thereof) for efficient construction of polar codes, in accordance with certain aspects of the present disclosure.

The controller/processor 659 and/or other processors, components and/or modules at the UE 650 and/or the controller/processor 675 and/or other processors, components and/or modules at the eNB 610 may perform or direct operations, for example, operations 900 and 1000 in FIGS. 9 and 10 respectively, and/or other processes for the techniques described herein for implementing the efficient construction of polar codes. In certain aspects, one or more of any of the components shown in FIG. 6 may be employed to perform example operations 900 and 1000, and/or other processes for the techniques described herein. The memories 660 and 676 may store data and program codes for the UE 650 and eNB 610 respectively, accessible and executable by one or more other components of the UE 650 and the eNB 610.

Example Techniques for Constructing Polar Codes

Figure 7:
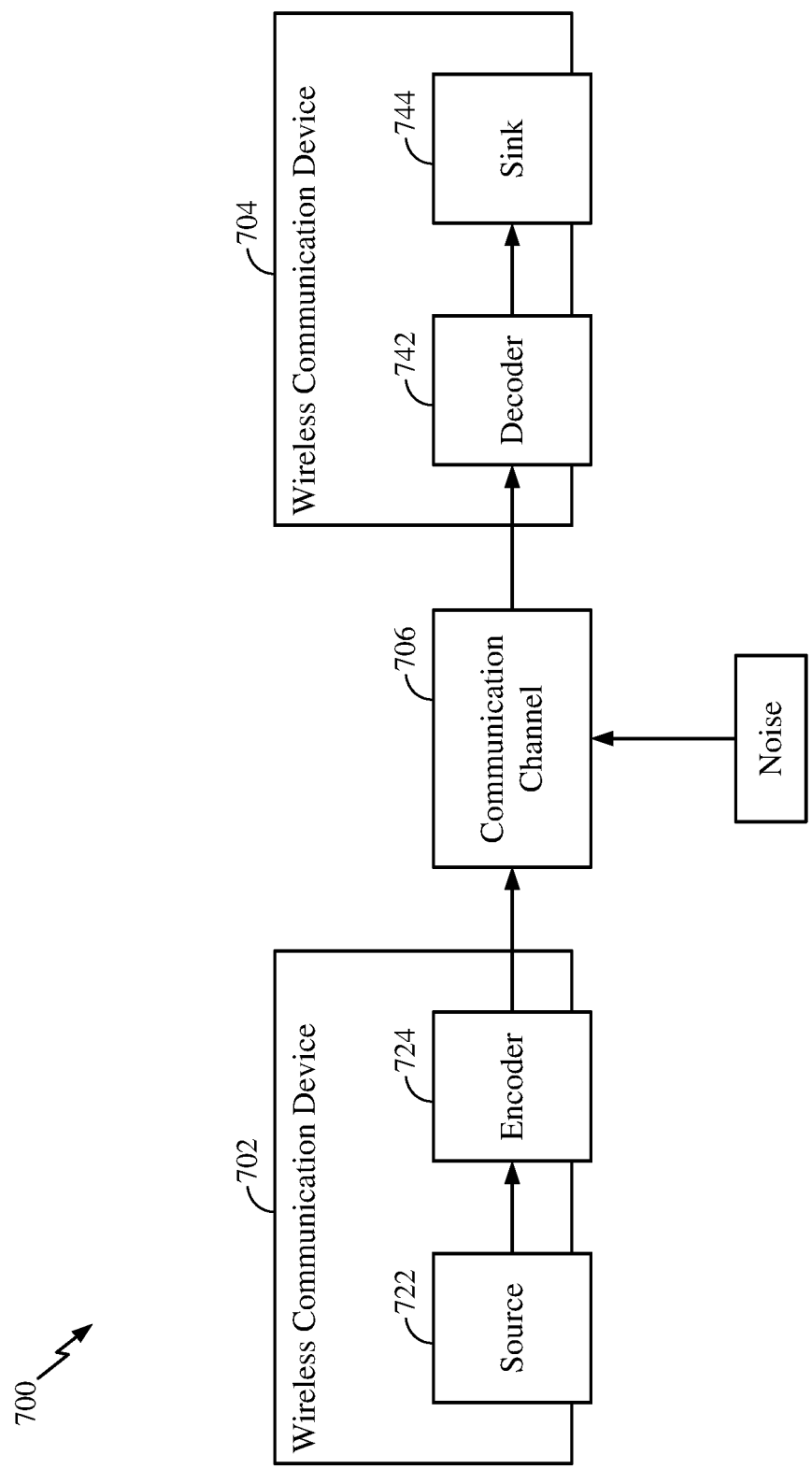
FIG. 7 is a schematic illustration of wireless communication between a first wireless communication device 702 and a second wireless communication device 704.

FIG. 7 is a schematic illustration 700 of wireless communication between a first wireless communication device 702 and a second wireless communication device 704. In the illustrated example, the first wireless communication device 702 transmits a digital message over a communication channel 706 (e.g., a wireless channel) to the second wireless communication device 704. One issue in such a scheme that must be addressed to provide for reliable communication of the digital message, is to take into account the noise that affects the communication channel 706.

Block codes, or error correcting codes are frequently used to provide reliable transmission of digital messages over such noisy channels. In a typical block code, an information message or sequence is split up into blocks, each block having a length of K bits. An encoder 724 at the first (transmitting) wireless communication device 102 then mathematically adds redundancy to the information message, resulting in codewords having a length of N, where N>K. Here, the code rate R is the ratio between the message length and the block length: i.e., R=K/N. Exploitation of this redundancy in the encoded information message is the key to reliability of the message, enabling correction for any bit errors that may occur due to the noise. That is, a decoder 742 at the second (receiving) wireless communication device 704 can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

Polar codes are linear block error correcting codes invented in 2007 by Erdal Arikan, and currently known to those skilled in the art. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Figure 8:
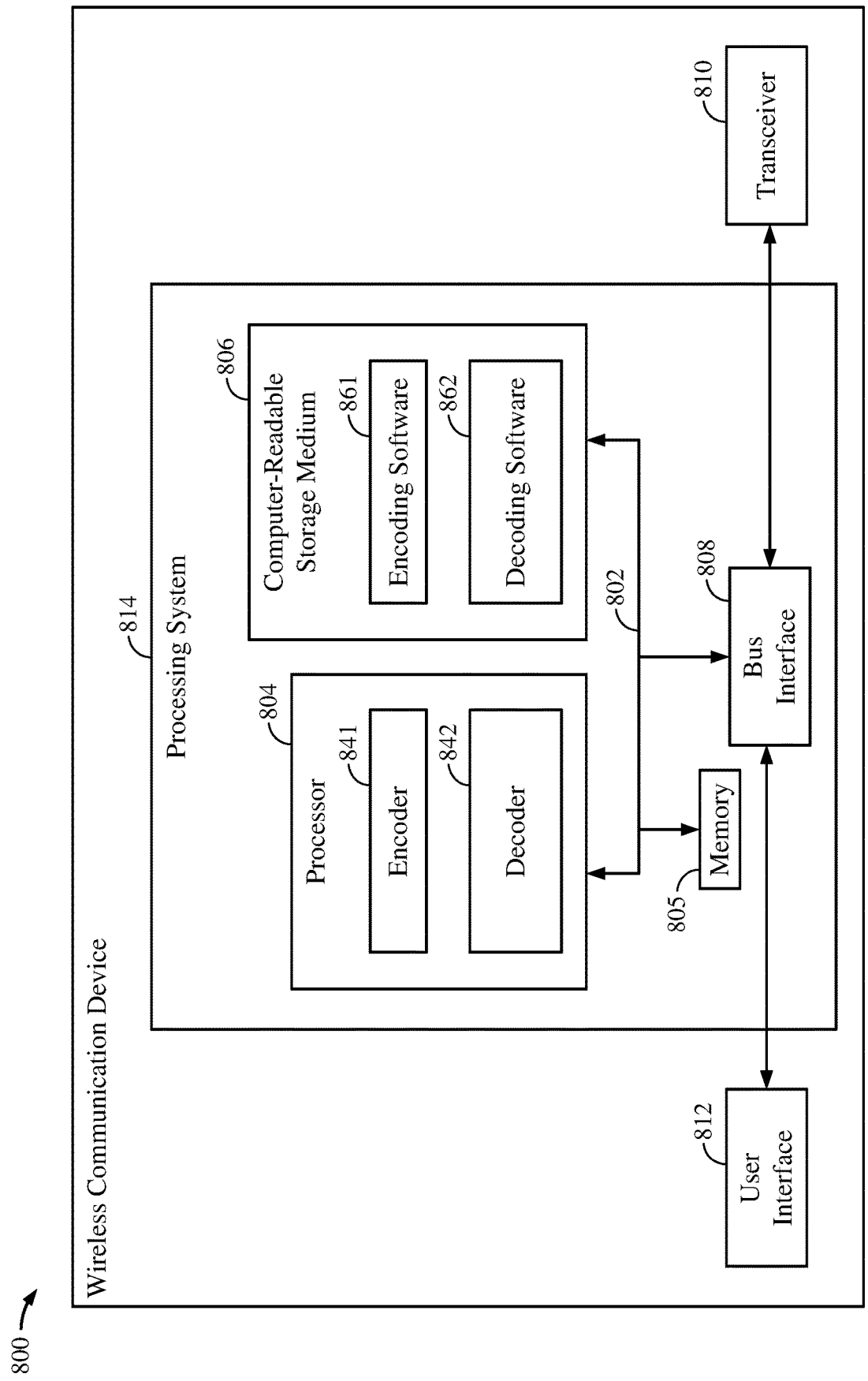
FIG. 8 is a block diagram illustrating an example of a hardware implementation for a wireless communication device 800 employing a processing system 814.

FIG. 8 is a block diagram illustrating an example of a hardware implementation for a wireless communication device 800 employing a processing system 814. In accordance with various aspects of the disclosure, an element, or any portion of an element, or any combination of elements may be implemented with a processing system 814 that includes one or more processors 804. For example, the wireless communication device 800 may be a user equipment (UE), a base station, or any other suitable apparatus or means for wireless communication. Examples of processors 804 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 804, as utilized in a wireless communication device 800, may be used to implement any one or more of the processes described below and illustrated in FIGS. 9-12.

In this example, the processing system 814 may be implemented with a bus architecture, represented generally by the bus 802. The bus 802 may include any number of interconnecting buses and bridges depending on the specific application of the processing system 814 and the overall design constraints. The bus 802 links together various circuits including one or more processors (represented generally by the processor 804), a memory 805, and computer-readable media (represented generally by the computer-readable medium 806). The bus 802 may also link various other circuits such as timing sources, peripherals, voltage regulators, and power management circuits, which are well known in the art, and therefore, will not be described any further. A bus interface 808 provides an interface between the bus 802 and a transceiver 810. The transceiver 810 provides a means for communicating with various other apparatus over a transmission medium. Depending upon the nature of the apparatus, a user interface 812 (e.g., keypad, display, speaker, microphone, joystick) may also be provided.

The processor 804 may include an encoder 841, which may in some examples operate in coordination with encoding software 861 stored in the computer-readable storage medium 806. Further, the processor 804 may include a decoder 842, which may in some examples operate in coordination with decoding software 862 stored in the computer-readable medium 806.

The processor 804 is responsible for managing the bus 802 and general processing, including the execution of software stored on the computer-readable medium 806. The software, when executed by the processor 804, causes the processing system 814 to perform the various functions described below for any particular apparatus. The computer-readable medium 806 may also be used for storing data that is manipulated by the processor 804 when executing software.

One or more processors 804 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 806. The computer-readable medium 806 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer.

The computer-readable medium may also include, by way of example, a carrier wave, a transmission line, and any other suitable medium for transmitting software and/or instructions that may be accessed and read by a computer. The computer-readable medium 806 may reside in the processing system 814, external to the processing system 814, or distributed across multiple entities including the processing system 814. The computer-readable medium 806 may be embodied in a computer program product. By way of example, a computer program product may include a computer-readable medium in packaging materials.

Those skilled in the art will recognize how best to implement the described functionality presented throughout this disclosure depending on the particular application and the overall design constraints imposed on the overall system.

As noted above, Polar codes are the first codes with an explicit construction to provably achieve the channel capacity for symmetric binary-input discrete memoryless channels. The capacity may be achieved with a simple successive cancellation (SC) decoder. Polar codes and LDPC codes are two competitive candidates for 5G channel coding.

As noted above, Polar codes are block codes. The generate matrices of Polar codes may be submatrices of Hadamard matrices. Generally, each row of the generate matrices corresponds to a bit-channel. To construct Polar codes, the rows of the Hadamard matrices corresponding to the good channels are selected for information bits. The bad channels are used for frozen bits with fixed value of zeros. In a practical system, density evolution or Gaussian approximation is generally used to determine the bit-error probability of each channel. For example, if N information bits are desired, the best N channels (with low error probability) are selected for information bits while the remaining channels are designated as frozen bits. In general, the bit-error probabilities of all the channels are sorted to determine the best and worst channels, and a position of each bit channel is identified by a corresponding sorting index. Thus, the sorting indices of the bit channels are generally needed in order to construct polar codes.

The requirement of sorting the channel quality for Polar codes is generally different from Turbo codes. For example, for Turbo codes, it is easy to get the code word as long as the code structure is defined. Regarding Polar codes, to support different block sizes with different rates, different position sets for information bits are required indicating different possibilities for positions of the information bits. In addition, to get an optimum code construction, the position sets for information bits may be different even for the same block size with different rates.

In some cases, a Binary vector with 0s for positions of frozen bits and 1s for positions of information bits, is generally a good way to represent the position set for information bits. However, a very large memory may still be needed even if we save the vector for indication of the positions of information bits. For example, assuming 200 information block sizes are used and 10 rates are supported in a system, and that a binary vector with an average length of 1000 bits is used for representation of the position sets for information bits or frozen bits, a memory of 2 million bits may be needed to store the vectors for indicating the positions of the information bits. Further, puncturing may be used to obtain length-compatible polar codes having a variable code word whose block length is variable. Thus, if we consider rate matching for variable block sizes, the memory required to store the vectors may be, for example, 100 times more assuming only 100 variable block sizes are used for each rate. Thus, the memory required to store the vectors (e.g., sorting indices) indicating the position of information bits is generally very large.

Certain aspects of the present disclosure discuss techniques for constructing polar codes including generating vectors or sorting indices indicating position sets of information bits for the construction dynamically (e.g., "on the fly"), instead of storing pre-defined vectors in memory, thus saving memory and leading to a more efficient construction of polar codes for both traffic and control channels.

In certain aspects, a scheme of density evolution or Gaussian approximation (GA) may be used to determine channel quality (e.g., bit error probability for each bit channel). Density evolution has been known to be used for construction of polar codes, and is generally known to those skilled in the art, and therefore the details thereof are not described herein. It has also been known in the art to use a lower complexity version of density evolution utilizing Gaussian approximation (GA) of densities, for the construction of polar codes. Gaussian approximation is also known to those skilled in the art. Because of lower complexity, GA is widely used. Let's assume an all-zero code word with BPSK modulation is transmitted over Additive While Gaussian Channel (AWGN) channel. The mean and the variance of the receive Loglikelihood ratio (LLR) may be $$\frac{2}{\sigma^2} \text{ and } \frac{4}{\sigma^2},$$

respectively. For Polar codes with length of N bits, the GA scheme may be descripted as follows.

For example, input may be given by, $$e_{m,i} = \frac{2}{\sigma^2}$$

with m=log$_2$ N and i=1, . . . , N

The $e_{m,i}$ can be looked as the LLR of each channel at stage m. The $e_{0,i}$ can be looked as the initial LLR of each channel.

Proceeding may be given by, $$e_{l,i} = \phi^{-1}(1-\phi(e_{l+1,i}))(1-\phi(e_{l+1,i+\eta})))$$

$$e_{l,i+\eta} = e_{l+1,i} + e_{l+1,i+\eta}$$

Where $$l = m, m-1, \ldots, 0; i \in \{2\eta h + j \mid 0 \leq h < 2^l, 0 \leq j < \eta\}, \eta = 2^{m-l-1} \text{ and } \phi(x) = \begin{cases} 1 - \frac{1}{\sqrt{4\pi x}} \int_{-\infty}^{\infty} \tanh(z/2) e^{-\frac{(z-x)^2}{4x}} dz & x > 0 \\ 1 & x = 0 \end{cases}$$

Output of the GA scheme may be the sorting index of $e_{0,i}$ or the vector for the indication of the positions for information bits and frozen bits.

Thus, the output may be determined based on the noise variance and coded block size N. Thus, in an aspect, the vector of good channel positions (or sorting indices) may be generated on the fly as long as the noise variance and coded block size are known. In addition, the function and antifunction of $\phi(x)$ may be implemented by a look-up table for simplification. In certain aspects, the algorithm shown above may be modified to support variable blocks sizes by considering puncture patterns.

FIG. 9 illustrates example operations 900 performed by a transmitter (e.g., UE, eNB or any other network node or element thereof) for efficient construction of polar codes, in accordance with certain aspects of the present disclosure. Operations 900 begin, at 902, by determining at least one set of parameters corresponding to data to be transmitted and a set of indices (e.g., sorting indices) corresponding to bits of the data to be transmitted based on the set of parameters, the set of sorting indices indicating a position set of the bits to be transmitted. At 904, the transmitter polar encodes the data based at least on the set of parameters and the set of sorting indices to generate a coded block of the data. At 906, the transmitter transmits the coded block of the data. In an aspect, the set of parameters includes information block size K, coded block size N or construction SNR of $$\frac{1}{\delta^2},$$

or a combination thereof.

FIG. 10 illustrates example operations 1000 performed by a receiver (e.g., UE, eNB or any other network node or element thereof) for efficient construction of polar codes, in accordance with certain aspects of the present disclosure. Operations 1000 begin, at 1002, by receiving a coded block of data generated by polar encoding. At 1004, the receiver determines at least one set of parameters corresponding to the data and a set of sorting indices corresponding to bits of the data, based on the set of parameters, the set of sorting indices indicating a position set of the bits of the data. At 1006, the receiver decodes the received coded block of data based at least on the set of parameters and the set of sorting indices to obtain decoded data.

As noted above, the position set for information bits of data is necessary for construction of Polar codes. To obtain good performance, a large memory is needed to store the binary vectors which represent the position set. In general, GA algorithm is widely used to generate sorting index of the channel quality or the corresponding vector. In certain aspects, since the sorting index is determined based on parameters including the information block size K, the coded block size N and the construction SNR of $$\frac{1}{\delta^2},$$

it is easy for both the transmitter and receiver to generate the sorting indices on the fly as long as the three factors are known to them. In a practical system, a device may determine the information block size K and the coded block size N from control information known to the device. The construction SNR δ may be obtained from a pre-defined look-up, each pair of (N, K) in the look-up table corresponding to a particular value of the construction SNR δ.

Thus, to avoid the large memory for storing the sorting indices, aspects of the present disclosure propose generating the sorting indices of the channel quality or the vectors on the fly in both transmitter and receiver.

Constructing Polar Codes for a Traffic Channel

Figure 11:
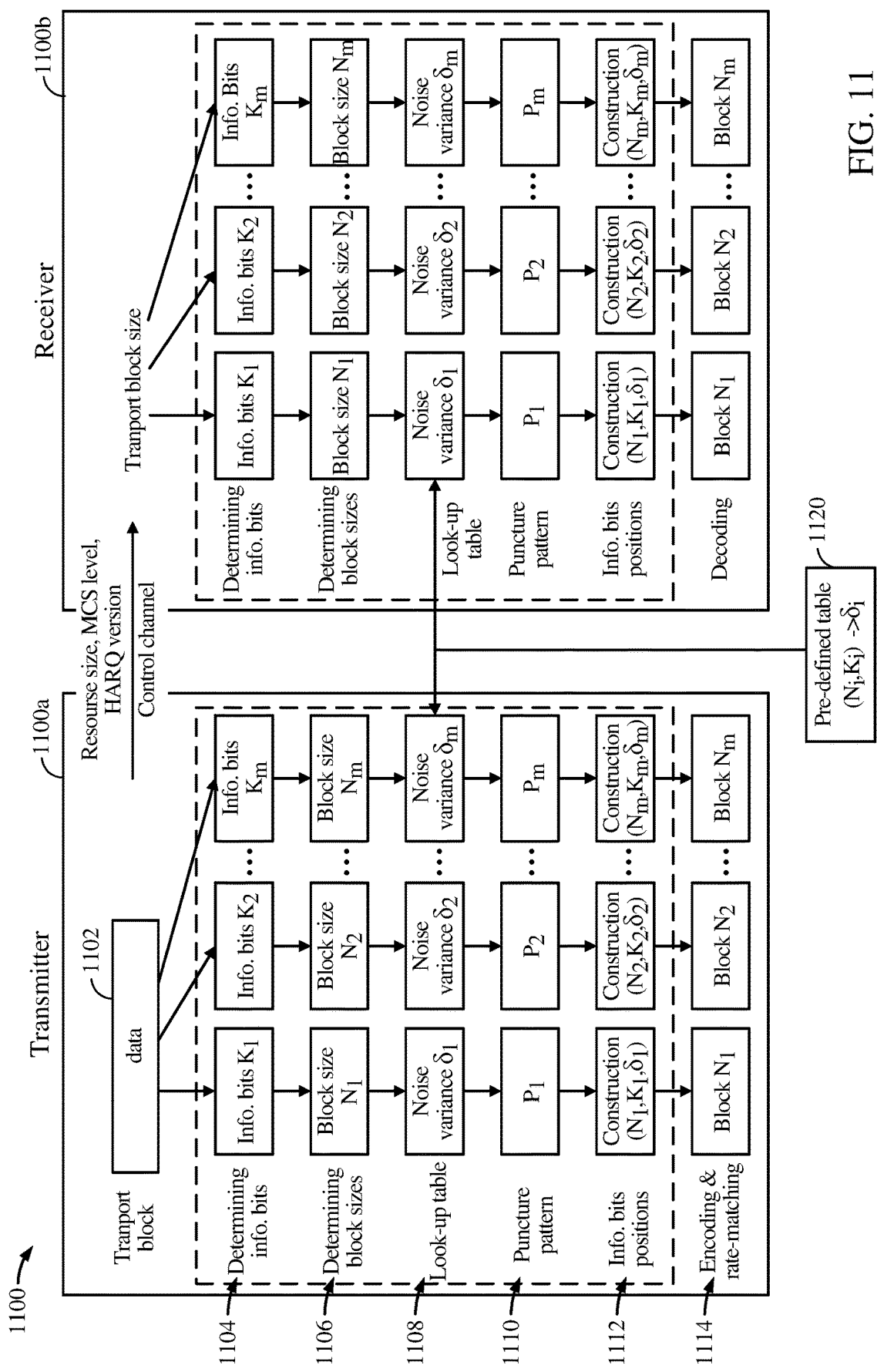
FIG. 11 illustrates an example 1100 of code construction for Polar codes for a traffic channel, in accordance with certain aspects of the present disclosure.

FIG. 11 illustrates an example 1100 of code construction for Polar codes for a traffic channel, in accordance with certain aspects of the present disclosure. In transmitter 1100a, the transport block 1102 of physical data to be transmitted is first divided into several information blocks 1104, for example, if the transport block size is larger than the maximum information block size defined for Polar codes. In an aspect, each information block 1004 has an information block size (e.g., number of information bits) $K_i$. In an aspect, a size of at least one of the information blocks 1004 is determined as the information block size $K_i$ for the construction of the Polar Codes. In an aspect, each information block's size may be determined as the information block size $K_i$ corresponding to the information block for construction of Polar Codes. The coded block size $N_i$ of code blocks 1106 may be determined, for example, based on the amount of resources allocated for transmission of the data. In an aspect, overhead such as reference signals is removed when the actual resource size is calculated. In an aspect, the coded block size $N_i$ may vary based on the allocated resource. For example, in LTE, different PRBs may have different amount of REs allocated for reference signals (RSs). These REs allocated for the RSs are generally removed from consideration before determining the actual resource size for calculating the coded block size. Different PRBs may have different amounts of REs allocated for RSs and thus may result in different coded block sizes.

After the information block size $K_i$ and coded block size $N_i$ are obtained, noise variance 1108 (e.g., construction SNR $\delta_i$) is obtained based on the code block size $N_i$ and the information block size $K_i$, for example from a predefined look-up table. In an aspect, in the look-up table, each pair of $(N_i, K_i)$ is mapped to a specific value for each construction SNR $\delta_i$ 1108. In an aspect, a value of the construction SNR $\delta_i$ is looked up from the look-up table, the value of the construction SNR $\delta_i$ in the look-up table corresponding to a combination of a value of the code block size $N_i$ and a value of the information block size $K_i$. In an aspect, the values of the construction SNR $\delta_i$ are optimized based on $N_i$ and $K_i$. In an aspect, the pre-defined look-up table may be generated and a copy of the look-up table may be stored in both the transmitter 1100a and the receiver 1100b. A puncture pattern 1110 is then determined (e.g., if puncturing is employed). After the puncture pattern 1110 has been determined, the sorting index 1112 of the channel quality is obtained by the GA algorithm using parameters set ($N_i$, $K_i$, $\delta_i$). In this way, the position set of each set of the information bits will be determined by the sorting indices. The coded blocks 1114 are obtained by Polar encoding and puncturing according to the puncture pattern.

In certain aspects, the transmitter 1100a transmits to the receiver 1100b, control information regarding one or more of resource size, MCS level, or HARQ version. In the receiver 1100b, the transport block size 1102 may be deduced from the control information such as resource size, MCS level, and HARQ version received from the transmitter. After the transport block size is known, the position of the information bits (e.g., sorting indices) is obtained by the similar procedure described for the transmitter. For example, the transport block 1102 is divided into several information blocks 1104, and the information block size $K_i$ of information block sizes, coded block size Ni, and the puncturing pattern 1110 is determined at the receiver by a similar procedure employed at the transmitter. In an aspect, the same predefined look-up table for mapping ($N_i$, $K_i$) into $\delta_i$ is applied for both transmitter and receiver. As a result, the position set of the information bits obtained at the transmitter is substantially identical to that obtained at the receiver. In this way, the received signal may be decoded correctly block by block at the receiver, for example, based on the parameter set ($N_i$, $K_i$, $\delta_i$) and the sorting indices determined at the receiver.

Constructing Polar Codes for a Control Channel

Figure 12:
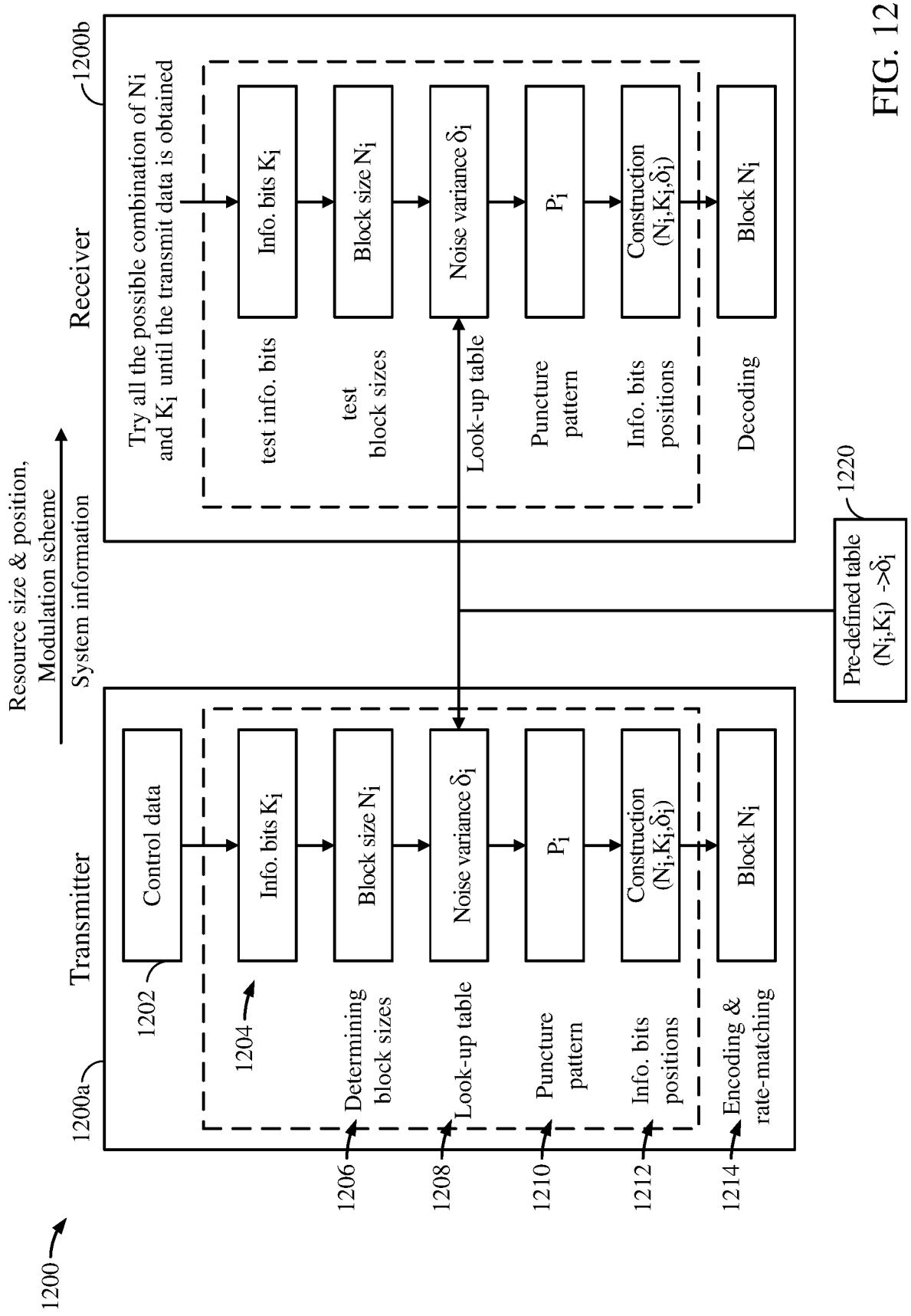
FIG. 12 illustrates an example 1200 of code construction for Polar codes for a traffic channel, in accordance with certain aspects of the present disclosure.

FIG. 12 illustrates an example 1200 of code construction for Polar codes for a traffic channel, in accordance with certain aspects of the present disclosure. In transmitter 1200a, the number of the information bits (e.g., information block size $K_i$ 1204) is determined by the size of the control data 1202. The coded block size $N_i$ of code blocks 1206 is determined by the resource allocated and the modulation used. The overhead such as reference signals are removed when the actual resource size is calculated for determining the coded block size $N_i$. After the information block size $K_i$ and coded block size $N_i$ are obtained, the noise variance 1208 (e.g., construction SNR $\delta_i$) is determined from the predefined look-up table. As discussed previously, in the table, each pair of ($N_i$, $K_i$) corresponds to a specific value of construction SNR $\delta_i$. The values of the construction SNR $\delta_i$ are optimized based on $N_i$ and $K_i$ predefined in the table. A puncture pattern 1210 is determined. After the puncture pattern 1210 has been determined, the sorting index 1212 of the channel quality is obtained by the GA algorithm using parameters of ($N_i$, $K_i$, $\delta_i$). In this way, the position set of the information bits is determined by the sorting indices 1212. The coded block 1214 is obtained by Polar encoding and puncturing according to the puncture pattern.

In an aspect, the coded block sizes for control channel are not transmitted directly to the receiver 1200b. In general, there are several sizes of coded blocks for the users with different wireless channel conditions. In the receiver 1200b, the possible coded block sizes are determined from predefinition or the system information such as resource size, resource position and modulation scheme (e.g., received from transmitter 1200*a*). After the coded block sizes are known, all the possible combinations of $N_i$ and $K_i$ are tested one by one with a procedure similar to that described above for the transmitter until the desired data is obtained. In an aspect, because the same predefined table for mapping ($N_i$, $K_i$) into $\delta_i$ is applied for both transmitter and receiver, the position set of information bits obtained in transmitter is substantially identical to that in receiver. In this way, the received signal is decoded correctly and control data is recovered.

In an aspect, optimum performance may be obtained based on the above described procedures for constructing polar codes as the optimum construction SNR is predefined for each pair ($N_i$, $K_i$).

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

Moreover, the term "or" is intended to mean an inclusive "or" rather than an exclusive "or." That is, unless specified otherwise, or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. A phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. An apparatus for decoding a polar code by a receiver, comprising:
    at least one processor configured to:
        receive a coded block of data generated by polar encoding;
        determine at least one set of parameters corresponding to the coded block of data;
        determine a set of sorting indices corresponding to bits of the coded block of data, the set of sorting indices determined using the set of parameters, the set of sorting indices indicating a position set of the bits of the data; and
        decode the coded block of data at least according to the set of parameters and the set of sorting indices to obtain decoded data; and
    a memory coupled to the at least one processor.

2. The apparatus of claim 1, wherein the at least one set of parameters includes an information block size K, and wherein the at least one processor is configured to determine the at least one set of parameters by:
    dividing a transport block having the data to be transmitted into a plurality of information blocks; and
    determining the information block size as a size of at least one of the information blocks.

3. The apparatus of claim 2, wherein the at least one processor is further configured to:
    receive information regarding at least one of a resource size, Modulation and Coding Scheme (MCS) size, or Hybrid Automatic Repeat Request (HARM) version corresponding to the received data; and
    determine a size of the transport block based on the received information.

4. The apparatus of claim 2, wherein the at least one set of parameters includes a coded block size N, and wherein the at least one processor is configured to determine the at least one set of parameters by determining the coded block size N based at least on information regarding resources allocated for transmission of the data.

5. The apparatus of claim 4, wherein the at least one set of parameters includes a construction Signal to Noise Ratio (SNR) $\delta$, and wherein the at least one processor is configured to determine the at least one set of parameters by determining the construction SNR $\delta$ based on the information block size K and the coded block size N.

6. The apparatus of claim 5, wherein the at least one processor is configured to determine the construction SNR $\delta$ based on the information block size K and the coded block size N by:
    looking up, from a look-up table a value of the construction SNR $\delta$ corresponding to the values of the information block size K and the coded block size N, the look-up table mapping each pair of values corresponding to the information block size K and the coded block size N to a value of the construction SNR $\delta$.

7. The apparatus of claim 6, wherein the at least one processor is configured to determine the set of sorting indices by performing Gaussian approximation utilizing at least the information block size K, the coded block size N, and the construction SNR $\delta$ to determine the set of sorting indices.

8. A method for decoding a polar code by a receiver, comprising:
    receiving a coded block of data generated by polar encoding;
    determining at least one set of parameters corresponding to the coded block of data;
    determining a set of sorting indices corresponding to bits of the coded block of data, the set of sorting indices determined using the set of parameters, the set of sorting indices indicating a position set of the bits of the data; and decoding the coded block of data at least according to the set of parameters and the set of sorting indices to obtain decoded data.

9. The method of claim 8, wherein the at least one set of parameters includes an information block size K, and wherein determining the at least one set of parameters comprises:

dividing a transport block having the data to be transmitted into a plurality of information blocks; and determining the information block size as a size of at least one of the information blocks.

10. The method of claim 9, further comprising:

receiving information regarding at least one of a resource size, Modulation and Coding Scheme (MCS) size, or Hybrid Automatic Repeat Request (HARQ) version corresponding to the received data; and determining a size of the transport block based on the received information.

11. The method of claim 9, wherein the at least one set of parameters includes a coded block size N, and wherein determining the at least one set of parameters comprises determining the coded block size N based at least on information regarding resources allocated for transmission of the data.

12. The method of claim 11, wherein the at least one set of parameters includes a construction Signal to Noise Ratio (SNR) $\delta$, and wherein determining the at least one set of parameters comprises determining the construction SNR $\delta$ based on the information block size K and the coded block size N.

13. The method of claim 12, wherein determining the construction SNR $\delta$ based on the information block size K and the coded block size N comprises:

looking up, from a look-up table a value of the construction SNR $\delta$ corresponding to the values of the information block size K and the coded block size N, the look-up table mapping each pair of values corresponding to the information block size K and the coded block size N to a value of the construction SNR $\delta$.

14. The method of claim 13, wherein determining the set of sorting indices comprises performing Gaussian approximation utilizing at least the information block size K, the coded block size N, and the construction SNR $\delta$ to determine the set of sorting indices.

15. The method of claim 8, further comprising:

determining a puncturing pattern for puncturing bits of a determined coded block size N in an attempt to achieve a required block size M; and utilizing the puncturing pattern for decoding the code block of data.

* * * * *